(12) United States Patent
Stricker et al.

(10) Patent No.: US 7,709,930 B2
(45) Date of Patent: May 4, 2010

(54) TUNEABLE SEMICONDUCTOR DEVICE WITH DISCONTINUOUS PORTIONS IN THE SUB-COLLECTOR

(75) Inventors: Andreas Stricker, Essex Junction, VT (US); David Sheridan, Williston, VT (US); Jae-Sung Rieh, Fishkill, NY (US); Gregory Freeman, Hopewell Junction, NY (US); Steven Voldman, Burlington, NY (US); Stephen A. St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/568,156

(22) PCT Filed: Apr. 22, 2004

(86) PCT No.: PCT/US2004/012321

§ 371 (c)(1),
(2), (4) Date: Oct. 20, 2006

(87) PCT Pub. No.: WO2005/114738

PCT Pub. Date: Dec. 1, 2005

(65) Prior Publication Data

US 2007/0215978 A1 Sep. 20, 2007

(51) Int. Cl.
*H01L 29/66* (2006.01)
(52) U.S. Cl. ............... 257/565; 257/197; 257/E29.193
(58) Field of Classification Search .......... 257/E29.034, 257/197, 565, E29.193
See application file for complete search history.

(56) References Cited

U.S. PATENT DOCUMENTS

| 3,573,573 | A | 4/1971 | Moore |
| 4,400,713 | A | 8/1983 | Bauge et al. |
| 5,084,750 | A | 1/1992 | Adlerstein |
| 5,328,858 | A | 7/1994 | Hikida |
| 5,376,823 | A | 12/1994 | Kojima et al. |
| 5,455,448 | A | 10/1995 | Benjamin |

(Continued)

FOREIGN PATENT DOCUMENTS

JP 51150984 12/1976

(Continued)

OTHER PUBLICATIONS

Application No. PCT/US04/12321—Filed: Apr. 22, 2004 Andreas Stricker, et al. - "HBT performance tuning by masking the subcollector" International Search Report dated Dec. 10, 2004.

*Primary Examiner*—Lynne A Gurley
*Assistant Examiner*—Vernon P Webb
(74) *Attorney, Agent, or Firm*—Joseph P. Abate; Daryl Neff

(57) ABSTRACT

Disclosed is a method of forming a semiconductor structure that includes a discontinuous non-planar sub-collector having a different polarity than the underlying substrate. In addition, this structure includes an active area (collector) above the sub-collector, a base above the active area, and an emitter above the base. The distance between the discontinuous portions of the discontinuous sub-collector tunes the performance characteristics of the semiconductor structure. The performance characteristics that are tunable include breakdown voltage, unity current gain cutoff frequency, unity power gain cutoff frequency, transit frequency, current density, capacitance range, noise injection, minority carrier injection and trigger and holding voltage.

8 Claims, 11 Drawing Sheets

U.S. PATENT DOCUMENTS

| | | |
|---|---|---|
| 5,567,961 A | 10/1996 | Usagawa et al. |
| 6,956,266 B1 * | 10/2005 | Voldman et al. ............ 257/371 |
| 2003/0173580 A1 * | 9/2003 | Coolbaugh et al. .......... 257/183 |
| 2005/0151223 A1 * | 7/2005 | Voldman .................... 257/510 |

FOREIGN PATENT DOCUMENTS

| | | |
|---|---|---|
| JP | 4000723 A | 1/1992 |
| WO | WO9717726 | 5/1997 |

* cited by examiner

TUNEABLE SEMICONDUCTOR DEVICE WITH DISCONTINUOUS PORTIONS IN THE SUB-COLLECTOR

BACKGROUND OF THE INVENTION

1. Field of the Invention

The present invention generally relates to various semiconductor structures and more particularly to an improved structure that includes improved sub-collector areas that have non-planar surfaces.

2. Description of the Related Art

With mixed voltage interface (MVI) applications, the desire to have multiple MOSFET (Metal Oxide Semiconductor Field Effect Transistor) devices and multiple bipolar transistors in CMOS (Complementary Metal Oxide Semiconductor) and BiCMOS (Bipolar CMOS) technologies is common practice. It is also common practice in CMOS to have thin oxide, and dual oxide MOSFET devices to provide this capability. Additionally, in BiCMOS technology, both a high breakdown (HB) and high performance (HP) BJT (Bipolar Junction Transistor) (or HBT) device is desirable for mixed voltage applications that require both high voltage interfaces as well as performance requirements. The addition of multiple oxides and multiple transistors is achieved using additional process steps. These processes all add additional cost to the technology. As technologies become more advanced, the number of supported MOSFETs and bipolar devices increases. As a result, it is advantageous to provide both active and passive elements which can be achieved with less process expense, a reduced number of masks and less processing steps.

To continue to reduce cost, and maintain dimensional similitude, the vertical profiles of transistors are scaled (reduced in size) laterally and vertically. To lower costs, epitaxial regions are scaled in the vertical dimension. Additionally, with epitaxial elimination, sub-collectors are required to be implanted due to limitation on the high energy implanter and dose throughput at higher energies. The manufacturing of high performance (HP) homo-junction bipolar junction transistors (BJT) and hetero-junction bipolar transistors (HBT) and other similar structures requires the reduction of the vertical profile of the device as well as the reduction of transistor parasitics. In order to reduce the collector-to-emitter transit time of the carriers, it is preferable to position the sub-collector close to the collector-base junction. The benefits of collector doping profile reach a limit and, therefore, positioning the sub-collector close to the collector-base junction helps prevent the manufacture of a high breakdown (HB) device. However, no matter what selectively implanted collector profile is used, as the vertical profile is scaled, electric fields between the base and sub-collector increase, resulting in higher avalanche multiplication and eventually to a lower collector-emitter breakdown voltage (BVceo).

The sub-collector and "pedestal implants" are placed in a collector region to provide the reduction of the well-known Kirk effect. Heavily doped sub-collector regions are placed in transistor elements and the associated derivatives to provide reduction of the Kirk effect. Additionally, the "pedestal implant" is brought closer to the surface to provide a lessened Kirk effect to achieve a lower breakdown voltage and higher frequency device. This pedestal implant requires an additional implant process step and adds cost to a semiconductor process. To obtain a high breakdown (HB) transistor, there is no pedestal implant but a planar sub-collector region with a planar top and bottom surface. To provide a high performance (HP) transistor, the additional "pedestal implant" is placed above the sub-collector region to minimize the motion of the base-collector metallurgical junction during high current operation.

With the scaling of the vertical profile, implanted sub-collectors are utilized instead of the epitaxially formed sub-collector regions. Hence the vertical scaling of the sub-collector requires a lower dose implant in the sub-collector region. As the hot process is reduced, and shallower vertical profiles are archived, the sub-collector implant dose and energy must be reduced. This leads to higher collector sheet resistances, and lower unity power gain cutoff frequency ($f_{MAX}$). Additionally, the narrower and lower dose sub-collector region leads to higher vertical injection into the substrate region. For heavily doped sub-collectors, the well-known Auger recombination is a dominant source of recombination in the collector region. Minority carrier recombination in the wide and heavily doped sub-collector regions minimize minority carrier injection to the collector-substrate region and into the semiconductor chip substrate. As a result, the scaling of the vertical profile leads to a higher injection into the substrate wafer, which can increase the noise in adjacent circuitry or elements.

The increase in the minority carrier injection into the substrate can also lead to latchup. Latchup occurs from formation of parasitic pnp element cross-couple with npn elements. Hence it is a motivation to minimize noise injection to prevent "external latchup" or "internal latchup" in a semiconductor chip.

The invention described below provides structures and methods to address these aforementioned issues.

SUMMARY OF THE INVENTION

The invention provides a semiconductor structure that includes a discontinuous non-planar sub-collector having a different polarity than the underlying substrate. In addition, this structure includes an active area (collector) above the sub-collector, a base above the active area, and an emitter above the base. The distance between the discontinuous portions of the discontinuous sub-collector tunes the performance characteristics of the semiconductor structure. The performance characteristics that are tunable include breakdown voltage, unity current gain cutoff frequency, unity power gain cutoff frequency, transit frequency, current density, capacitance range, noise injection, minority carrier injection and trigger and holding voltage.

The sub-collector has a higher impurity concentration than the remainder of the collector. Also, the sub-collector has non-planar upper and lower surfaces. The collector further comprises a second sub-collector between the substrate and the sub-collector. This second sub-collector can also be discontinuous.

The invention provides a method of forming such a semiconductor structure, which forms a first sub-collector in the substrate, forms a second discontinuous sub-collector above the first sub-collector in the substrate, and epitaxially grows the collector on the substrate. The process of epitaxially growing the collector expands the second discontinuous sub-collector and automatically provides doping to the collector.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
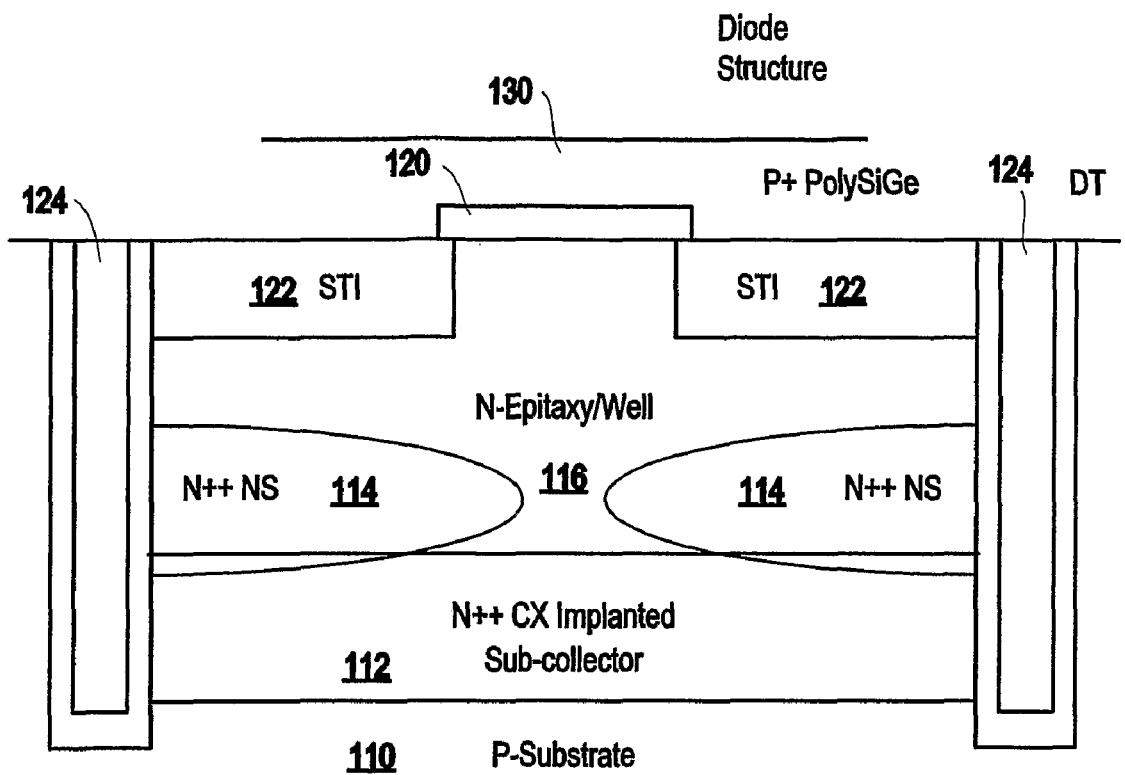
FIG. 1 is a schematic diagram of a diode structure.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention overcomes the high breakdown device problem discussed above by masking the doping of the sub-collector under the active area 116 of the HB device to form discontinuous sub-collector regions. The invention further provides continuously tunable RF and DC performance. Thus, with the invention it is possible to manufacture a high performance device (HP), a medium performance device (MP), and a high breakdown device (HB) on the same wafer without adding a masking step.

Figure 2:
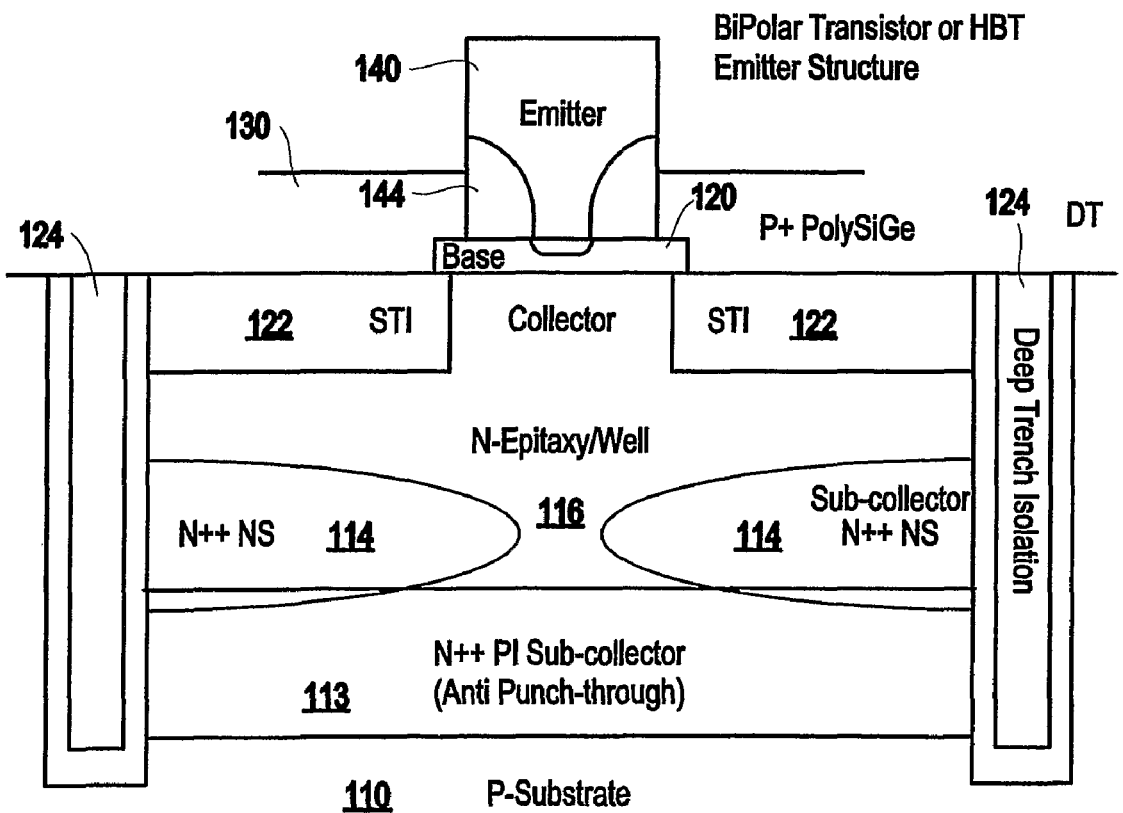
FIG. 2 is a schematic diagram of an NPN transistor.

More specifically, as shown in the embodiment in FIG. 2, the inventive structure has a sub-collector above a P-type substrate 110. The dopant polarity of the substrate will vary depending upon the specific structure being manufactured and one ordinarily skilled in the art would understand that the use of a P-type substrate is only one example in which the invention can be used and that the invention is not limited to this specific example. The sub-collector comprises discontinuous impurity regions 114 separated by a lower doped collector region 116 (in the three dimensional structure, the impurity region 114 can be, a for example, a ring or donut shaped structure). The dopant used for the discontinuous sub-collector shown in cross-section is preferably opposite that of the substrate 110. The invention is not limited to an impurity ring but allows for any multiple connected sub-collector region such as at least one implant on one edge. An active area 116 (the traditional "collector" in this structure) is also shown in FIG. 2. A raised base structure 120 and emitter structure 140 are above the active area 116.

The sub-collector can further comprise a second sub-collector layer 112 between the substrate 110 and the discontinuous sub-collector 114. Because the sub-collector 114 is discontinuous, the second sub-collector 112 is used to prevent undesirable shorting from the base 120 into the substrate 110 (punch through). However, the second sub-collector 112 is spaced at a sufficient distance from the collector 116/base 120 interface (at the top of the collector 116) to prevent the undesirable higher avalanche multiplication and lower collector-emitter break down voltage, which is discussed above. By utilizing a discontinuous sub-collector 114 above a lower sub-collector 112, the invention is able to reduce the collector-to-emitter transit time of carriers (because the discontinuous sub-collector 114 is close to the base 120), yet the invention does not suffer from undesirably low collector-emitter breakdown voltage (because of the openings within the discontinuous sub-collector layer 114) or undesirable punch through (because of the underlying lower sub-collector 112). Therefore, the invention allows the structure to be substantially reduced in size, without affecting performance.

Different dopant types can be used for the discontinuous sub-collector 114 such as Phosphorus, Arsenic, or Antimony. The doped level 112, 113 controls the level of current injection into the substrate for the vertical PNP. This doped layer 112, 113 can have a special type of doping impurity that is different than the discontinuous sub-collector 114. Because the doped layer 112, 113 is deeply buried into the substrate, one could use P instead of As. The doped layer's purpose is to prevent punch through of the inherent PNP and vertical injection to the substrate, minimizing noise injection and latchup concerns. The implant is not limited to P or As but can be Antimony or other n-type implants.

The structure can also include shallow trench isolation regions 122 on opposite sides of the active area 116. Thus, the active area 116 is between the shallow trench isolation regions 122 and extends down to the depletion region 116. Deep trench (DT) isolation regions are shown as items 124.

FIG. 1 illustrates a diode structure and therefore includes an upper polysilicon layer 130 that is doped similarly to the substrate 110. However, the invention is equally useful with many different types of structures including a bipolar transistor (FIG. 2), Schottky diodes (FIGS. 3 and 4), varactor (FIG. 5), thyrsitor (FIG. 6), diffused resistor, etc. Thus, the structures shown in FIGS. 2-6 are similar to the structure shown in FIG. 1.

Because FIG. 2 illustrates an NPN transistor (heterojunction bipolar transistor (HBT)), it includes an emitter 140 that is doped similarly to the active area 116. Therefore, FIG. 2 illustrates either a PNP or NPN structure depending upon the relative doping profiles of the active area 116, base 120, and emitter 140. A spacer 144 prevents short circuits between the emitter and the base layers 120 and 130. In addition, FIG. 2 utilizes a P-type doped anti punch-through layer 113. The doping profile of the blanket layer under the discontinuous sub-collector 114 is a trade-off between breakdown voltage, punch through, vertical injection and latchup.

Figure 3:
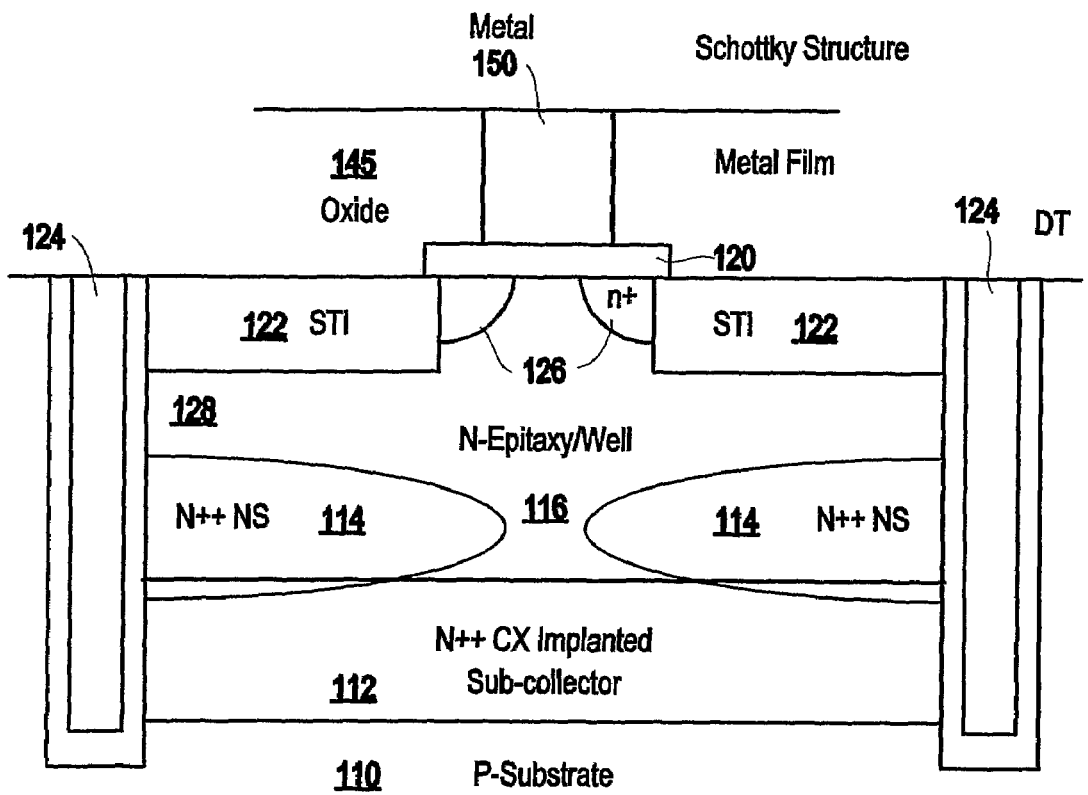
FIG. 3 is a schematic diagram of a Schottky diode.
Figure 4:
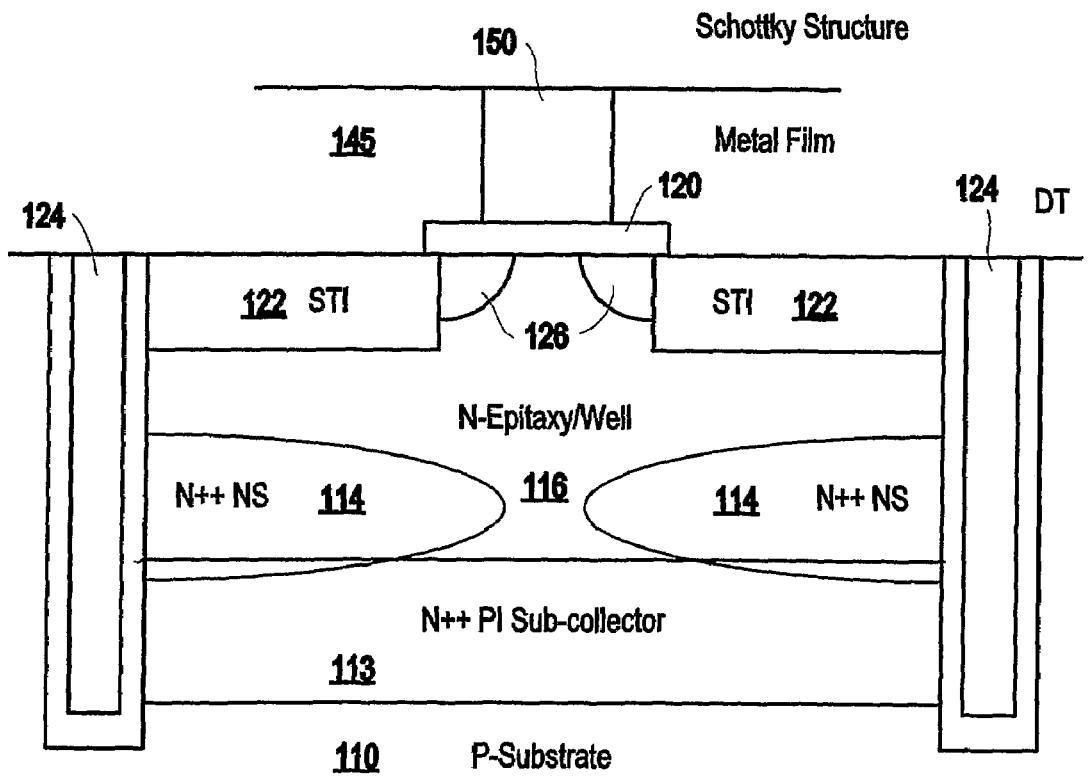
FIG. 4 is a schematic diagram of a Schottky diode.
Figure 5:
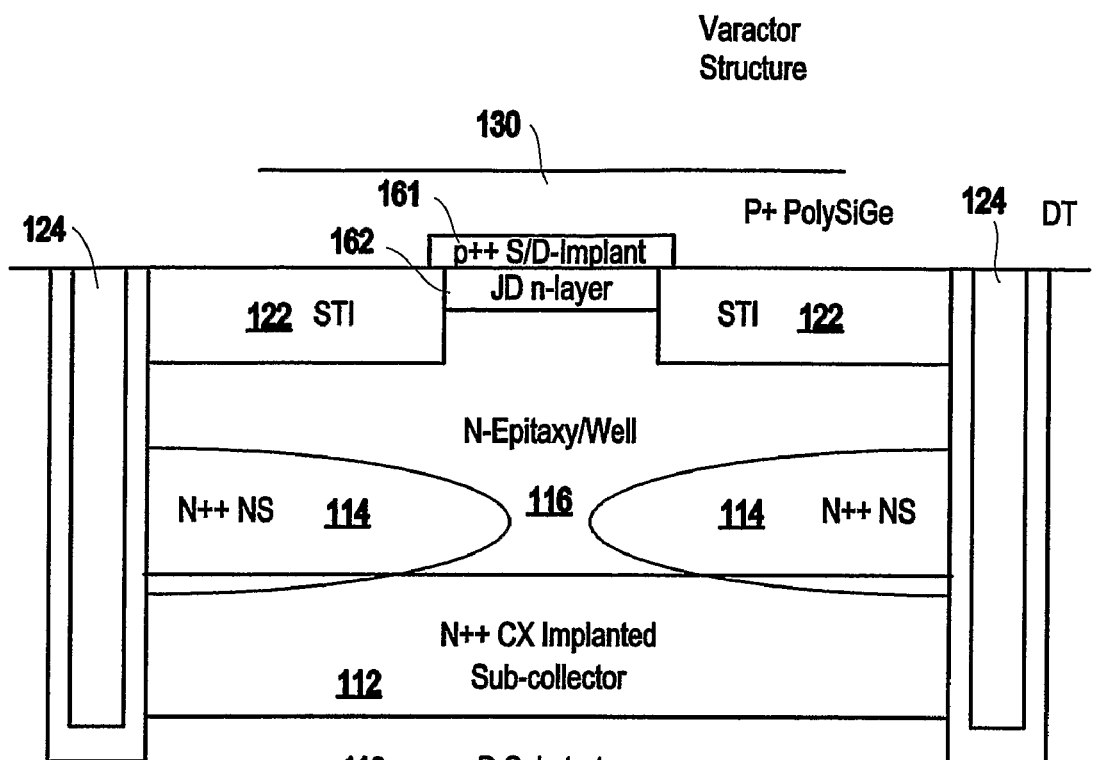
FIG. 5 a schematic diagram of a varactor structure.

FIGS. 3 and 4 illustrate Schottky diodes which include a metal film 150 and an oxide 145. Further, such structures include the n+ doped regions 126 in the corner of the base 120 and the shallow trench isolation 122. Similarly to FIG. 2, FIG. 4 uses the p-type dopant in the doped layer 113 for the same reasons. FIG. 5 illustrates a varactor structure that utilizes the inventive sub-collector. The anode of the varactor structure shown in FIG. 5 is built by a p+ by a polysilicon layer 130 above a p++ layer 161 which is implanted similar to a source/drain region in MOSFET. Below the anode is an n+ layer 162 between the shallow trench isolations 122. Together with p++ layer 161, this n+ layer 162 forms the active varactor junction. The cathode of the varactor is formed by an n-epitaxy/well 116, the discontinuous sub-collector 114 and the anti-punch-through layer 112 over a p-substrate 110.

Figure 6:
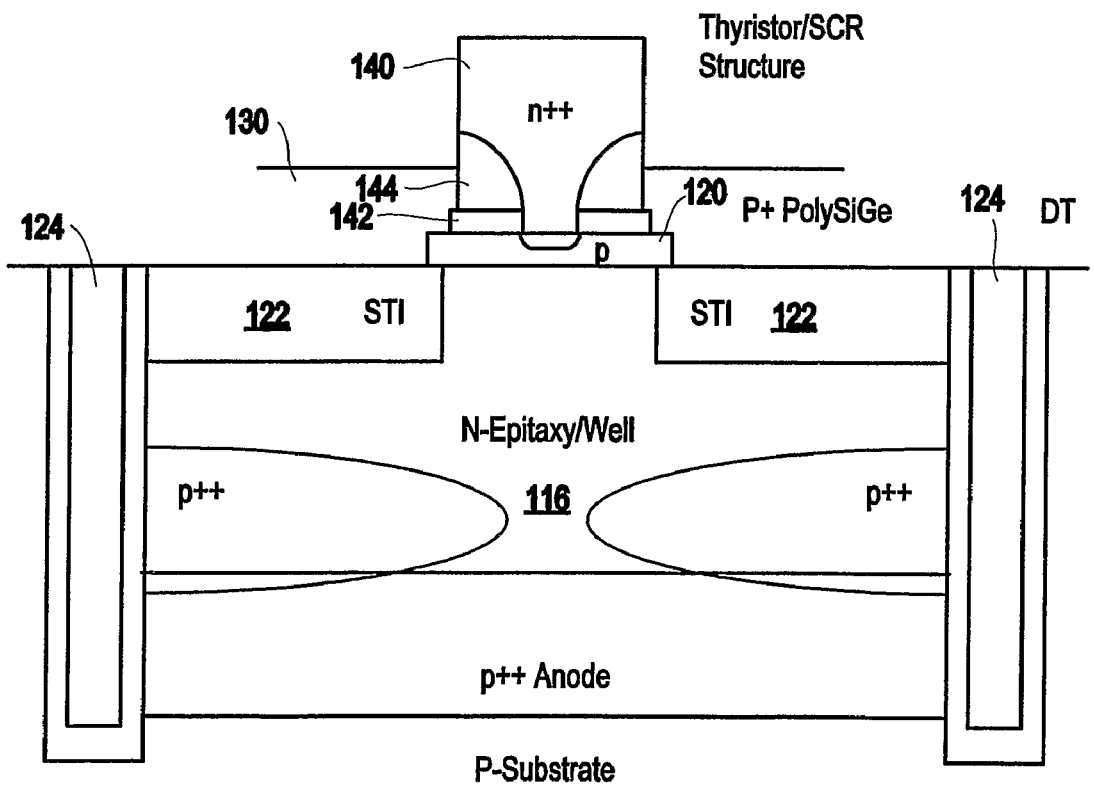
FIG. 6 a schematic diagram of a thyristor/SCR structure.

FIG. 6 depicts a thyristor/SCR structure comprising an n++ cathode 140 which out diffuses into a p-layer 120. Isolation between the cathode 140 and the gate 120 is provided with dielectric layers 144 and 142. Layer 120 is contacted by a p+ polysilicon layer 130 deposited above the shallow trench isolation 122. The gate 120 is positioned above a n-epitaxy/well layer 116, which is isolated from adjacent structures by either STI 122 or a deep trench 124. The anode of the thyristor is formed by the discontinuous layer 118 and the sub-collector layer 115 sitting above an n- or p-substrate 110.

There are a number of well-known processes that can be utilized to complete the semiconductor structure into the various diodes, varactors, thyristors, etc. shown in FIGS. 1-6. However, in order to avoid obscuring the salient features of the invention, a detailed explanation of these additional structures is omitted. Instead, this disclosure concentrates upon the novel sub-collector that is described above, because one ordinarily skilled in the art would readily understand how to complete the semiconductor structure into the various diodes, transistors, etc., once the novel sub-collector is in place.

Figure 7:
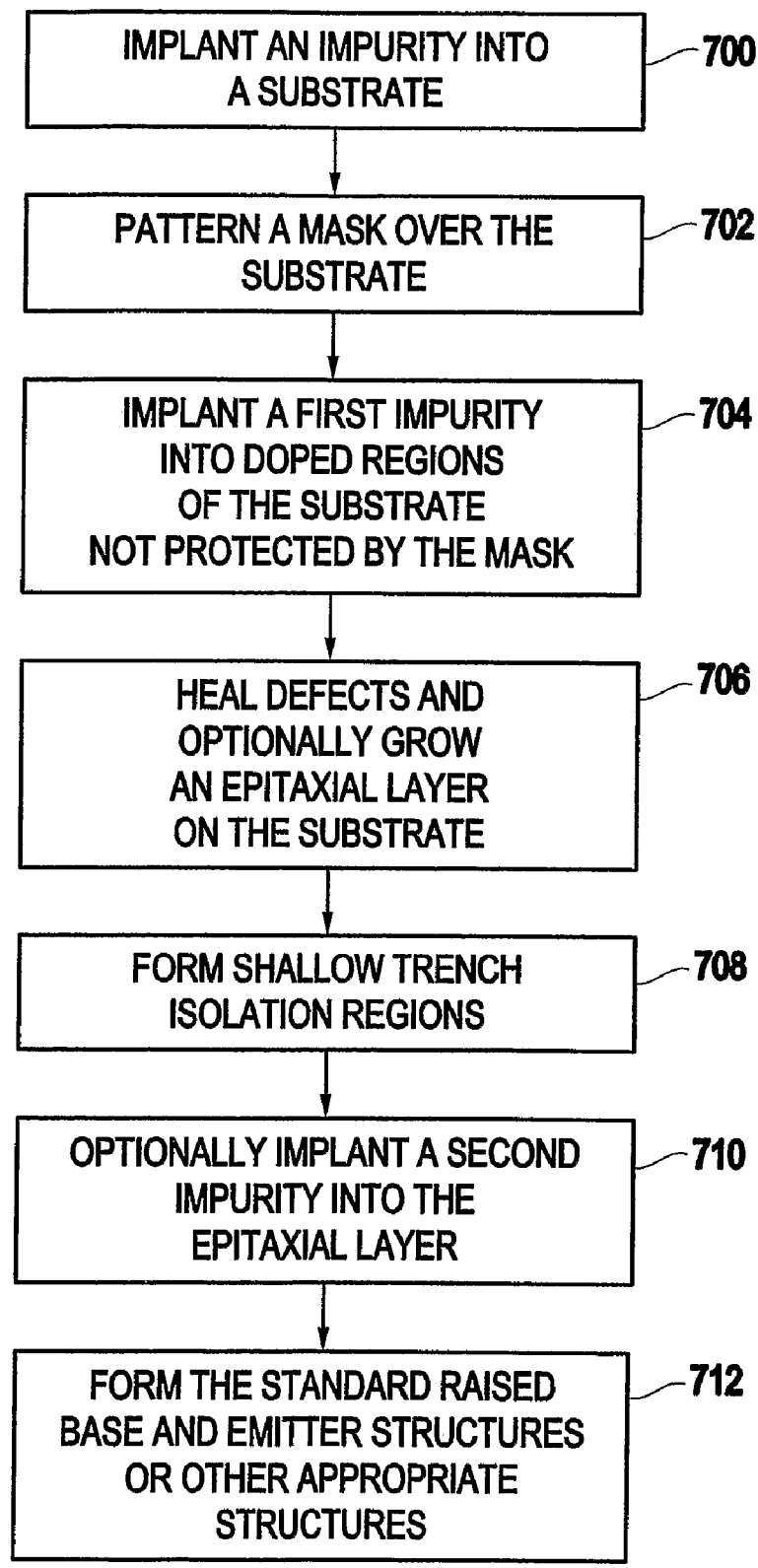
FIG. 7 is a flow diagram illustrating a preferred method of the invention.

Turning now to FIG. 7, the methodology of the invention is shown in flowchart form. The invention begins by implanting a sub-collector in 112 into a substrate 700. Next the invention patterns a mask over the substrate 702. A mask called Bx or Cx can be used in this step. The invention implants an impurity into regions of the substrate not protected by the mask 704 to form the discontinuous sub-collector 114. After removing the mask, the invention heals any defects and optionally grows an epitaxial layer on the substrate 706 (see the epitaxial and non-epitaxial processes illustrated in FIGS. 8-17, discussed below). Because of the heavy doping of the masked buried substrate, the epitaxial layer gets automatically doped with the same species. Thus, portions of the epitaxial layer that are grown above the doped regions of the substrate diffuses and expands the discontinuous sub-collector 114 within the lower portion of the epitaxial layer. The region of the epitaxial layer that is within the center of the impurity ring comprises a depletion region.

The inventive process continues by forming conventional shallow trench isolation regions 708 and optionally implanting a second impurity into the epitaxial layer 710 to define the collector 116. This processing forms the active area 116 between the shallow trench isolation regions and extending down to gaps in the discontinuous sub-collector 114. Then, various different conventional processing steps can be performed to complete the structure into any one of a different number of devices, such as transistors, diodes, varactors, etc. Thus, after the foregoing processing, the standard raised base and emitter structures or other appropriate structures are formed 712 depending upon the specific device (e.g., varactor, NPN diode, bipolar transistor, etc.) being manufactured.

Figure 11:
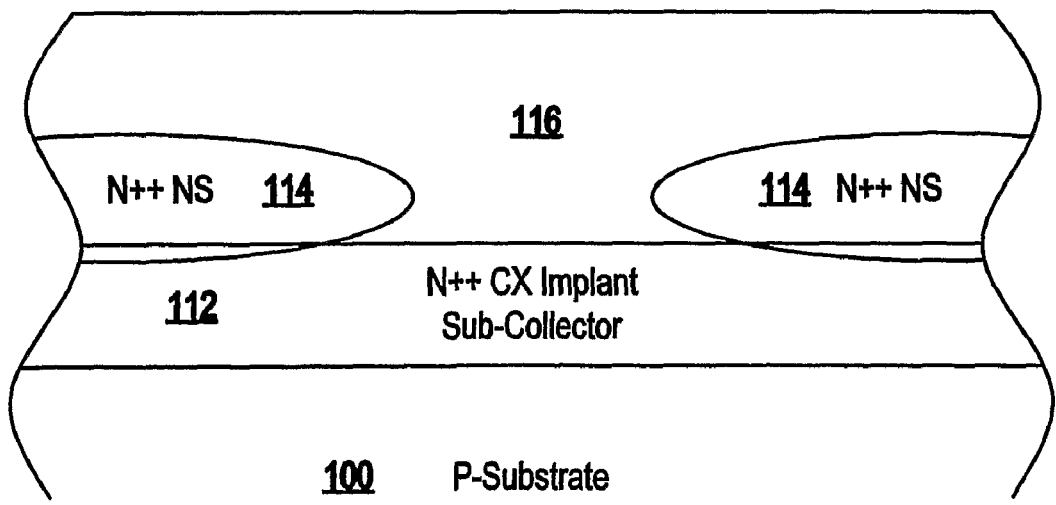
FIG. 11 is a schematic diagram illustrating a first epitaxial growth process.
Figure 12:
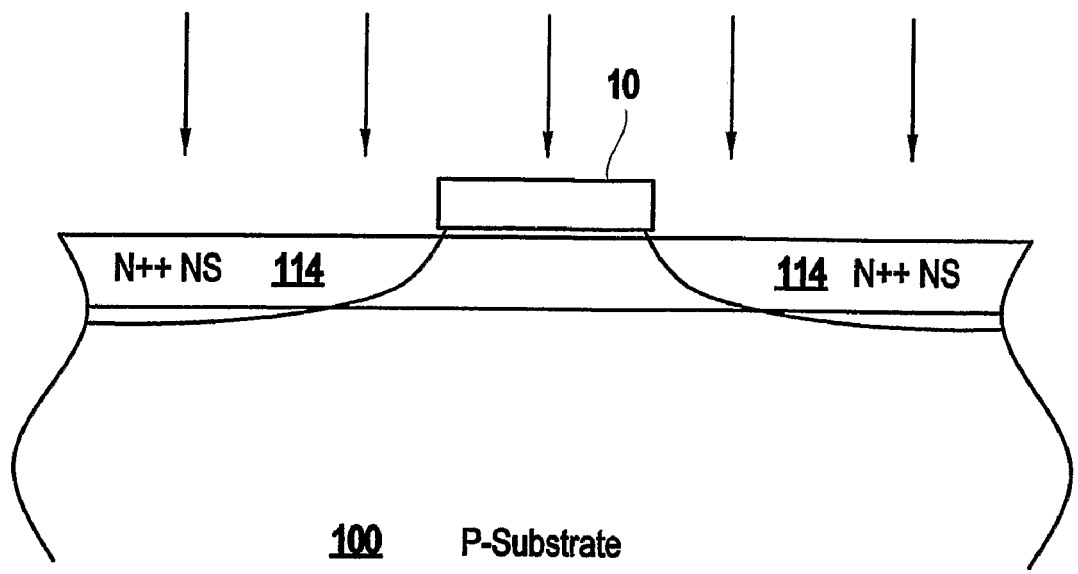
FIG. 12 is a schematic diagram illustrating a second epitaxial growth process.
Figure 13:
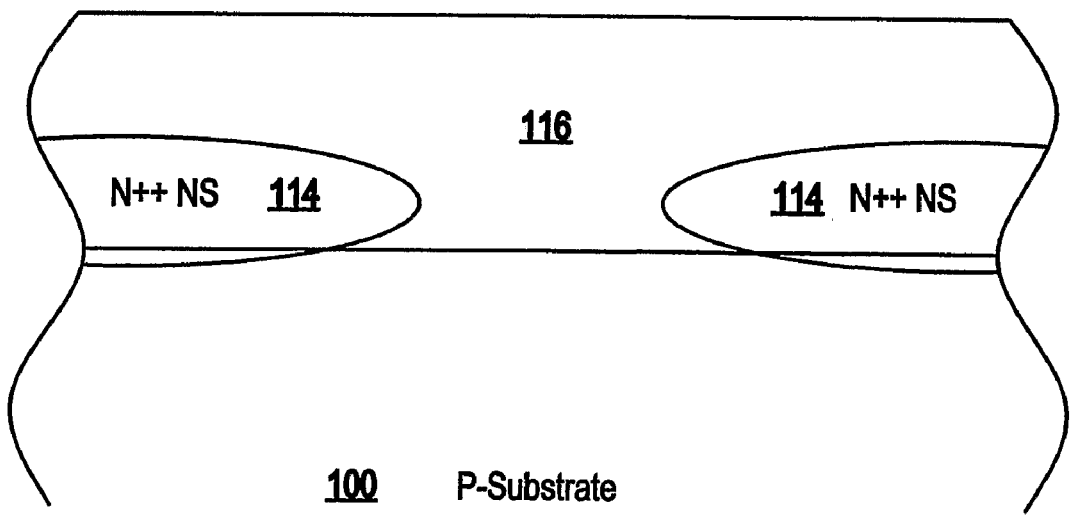
FIG. 13 is a schematic diagram illustrating a second epitaxial growth process.
Figure 14:
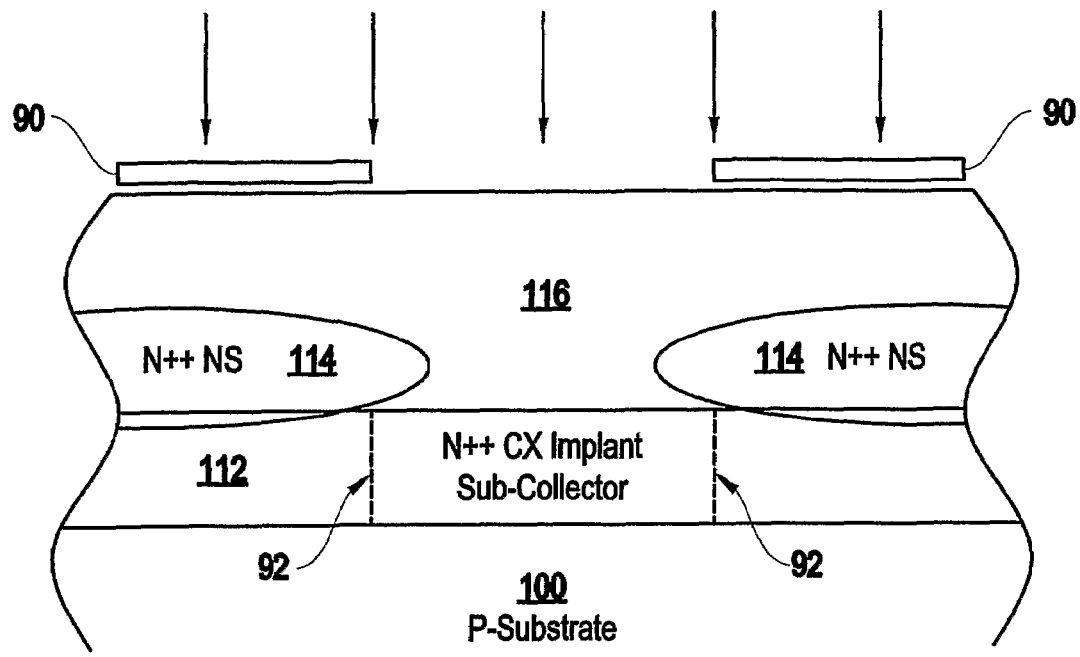
FIG. 14 is a schematic diagram illustrating a second epitaxial growth process.
Figure 15:
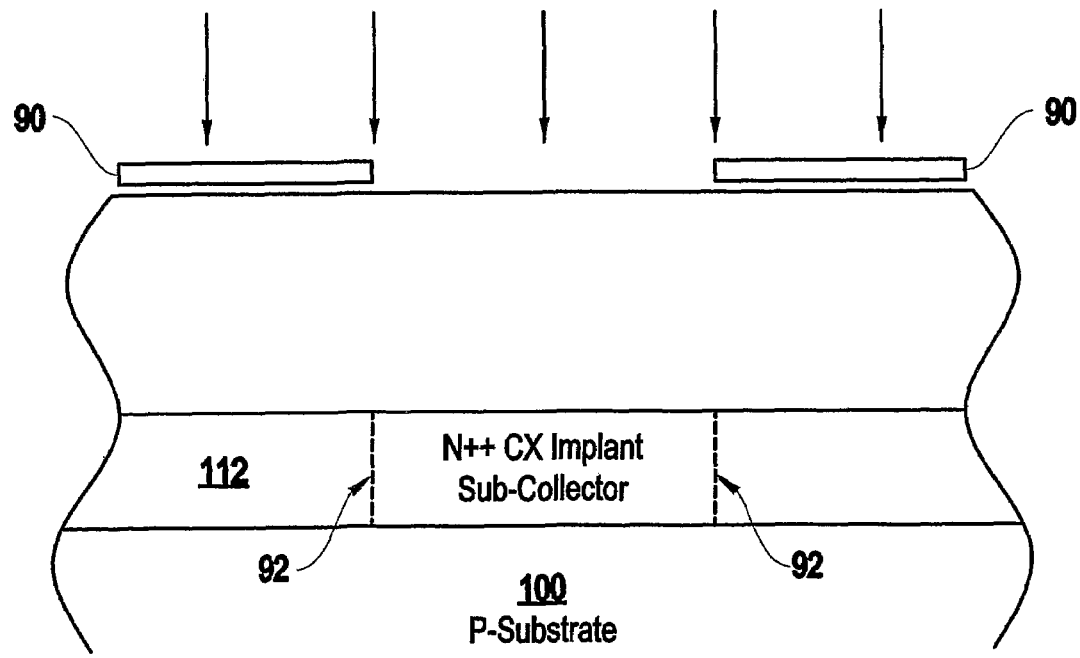
FIG. 15 is a schematic diagram illustrating a non-epitaxial implantation process.
Figure 16:
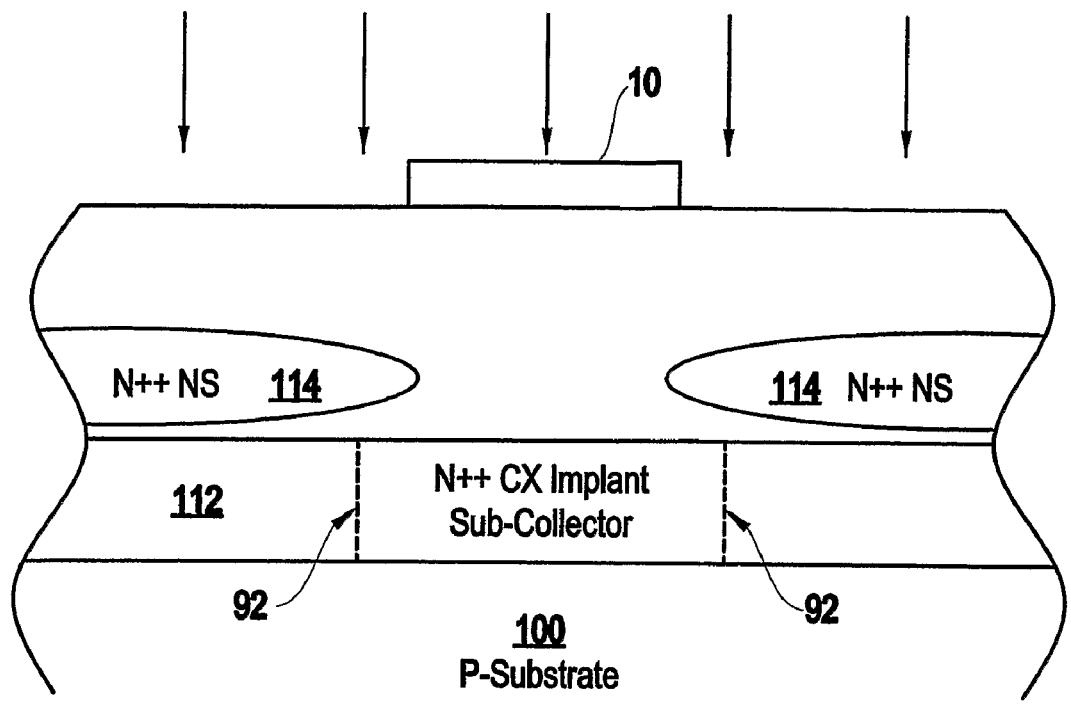
FIG. 16 is a schematic diagram illustrating a non-epitaxial implantation process.
Figure 17:
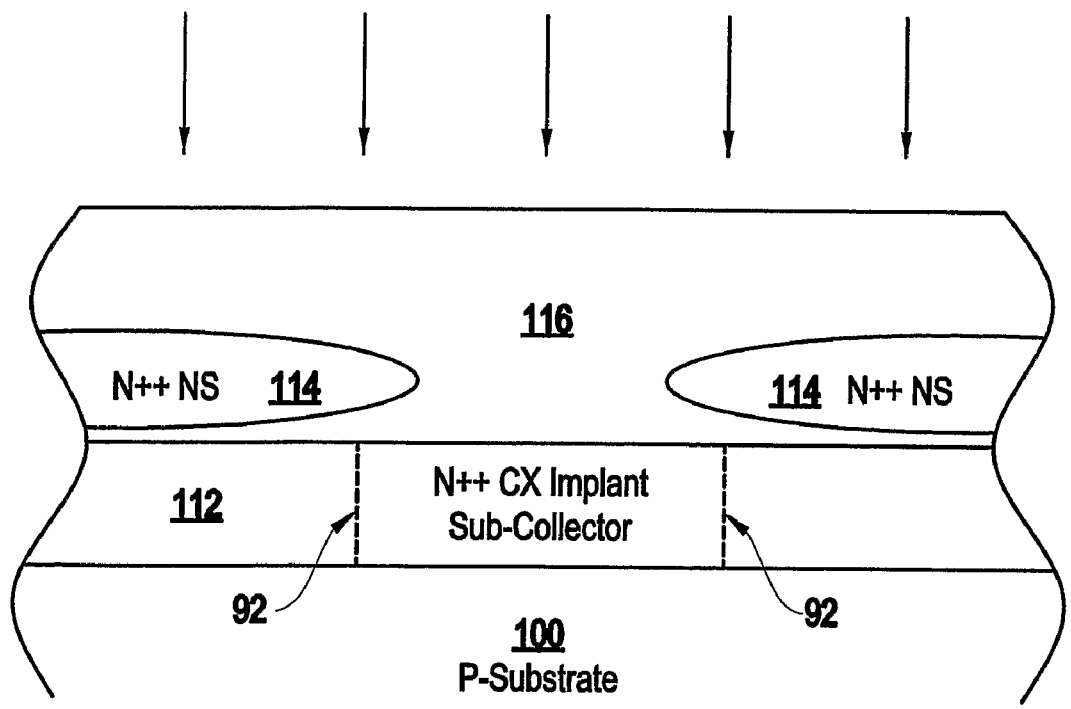
FIG. 17 is a schematic diagram illustrating a non-epitaxial implantation process.
Figure 18:
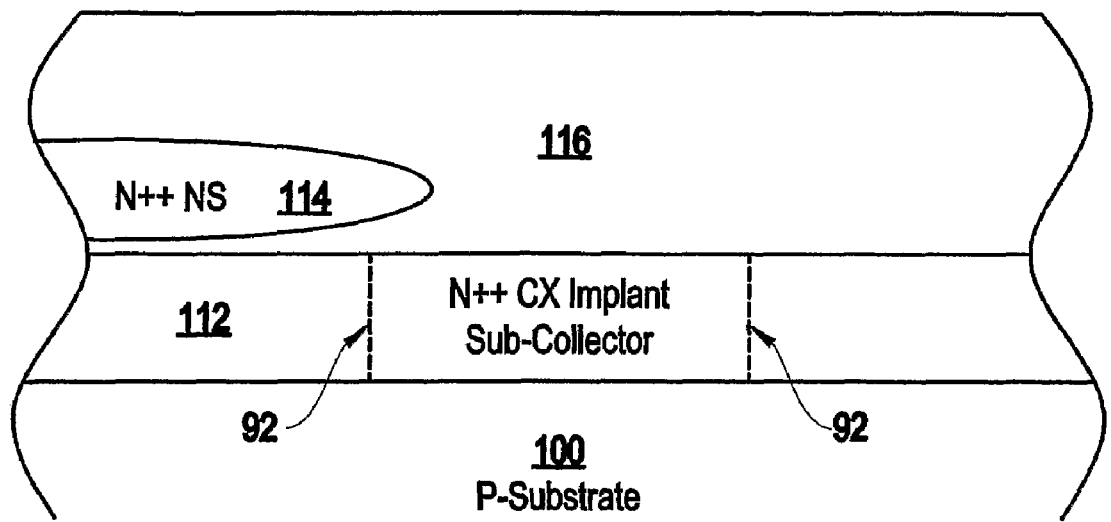
FIG. 18 is a schematic diagram illustrating an example of a type of sub-collector that can be formed with the invention.
Figure 19:
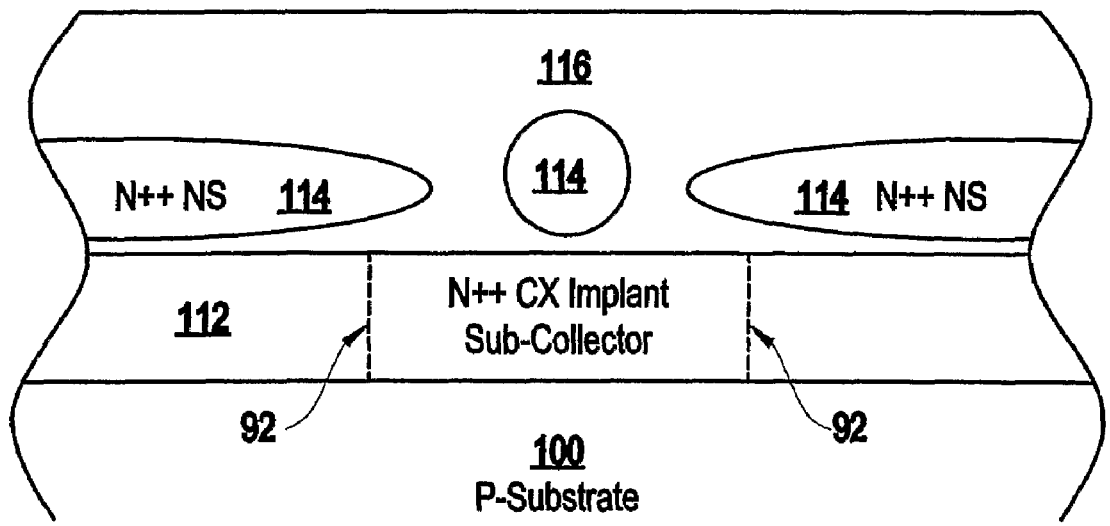
FIG. 19 is a schematic diagram illustrating an example of a type of sub-collector that can be formed with the invention.
Figure 20:
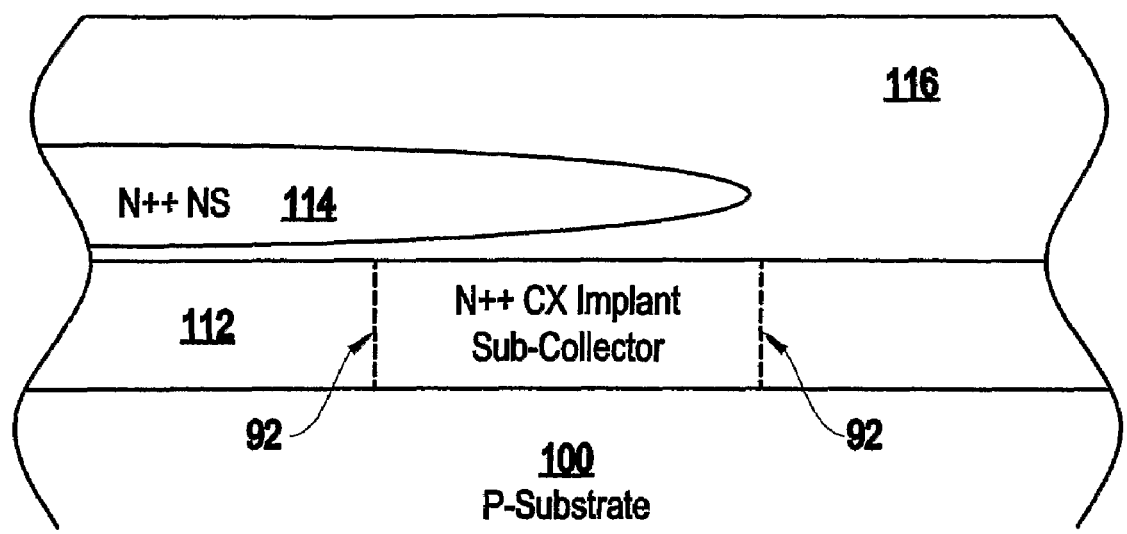
FIG. 20 is a schematic diagram illustrating an example of a type of sub-collector that can be formed with the invention.

Referring now to FIGS. 8-20, different embodiments used to form the inventive structure are shown in detail. More specifically, FIGS. 8A-11 illustrate a first epitaxial growth process; FIGS. 12-14 illustrates a second epitaxial growth process; FIGS. 15-17 illustrate a non-epitaxial implantation process. FIGS. 18-20 provide some examples of the different types of sub-collectors but can be formed with the invention.

Figure 8:
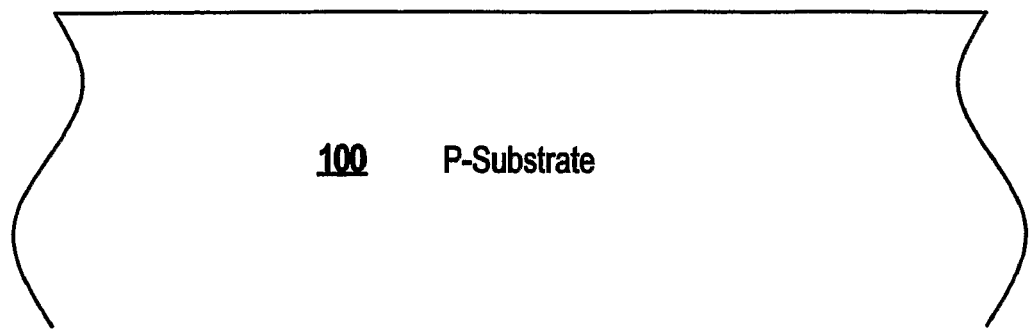
FIG. 8 is a schematic diagram illustrating a first epitaxial growth process.
Figure 9:
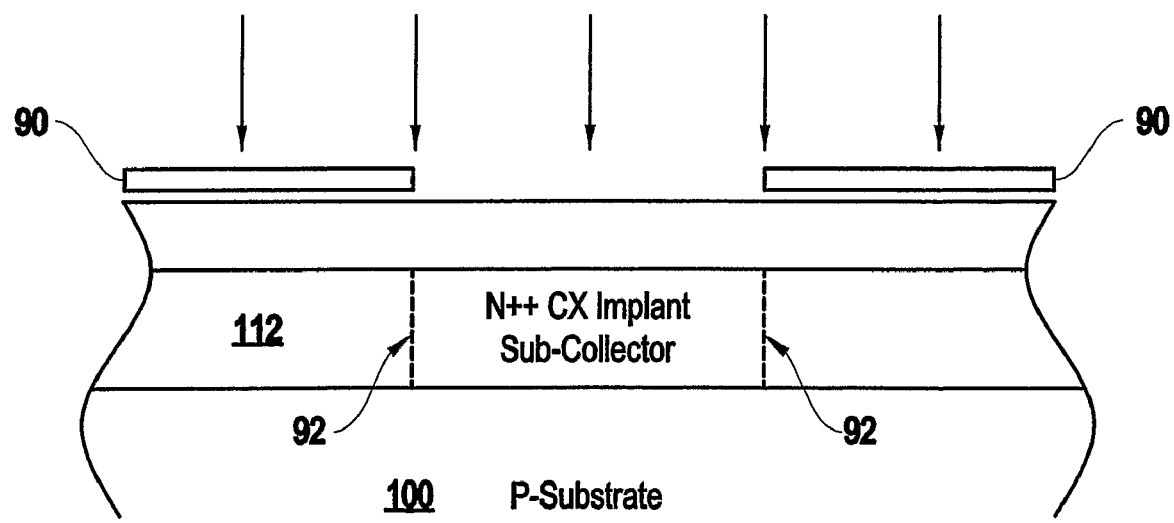
FIG. 9 is a schematic diagram illustrating a first epitaxial growth process.

More specifically, FIG. 8 illustrates the common beginning structure for the following embodiments which simply comprises a first type of substrate 100 such as a P-type substrate. The first type of epitaxial growth process begins as shown in FIG. 9 where the first sub-collector implant 112 is formed deeply into the substrate 100. In this example, the implant is an N++ type of implant and is formed at a level below the top of the substrate 100, and is therefore called a deep implant. The vertical depth of the implant is controlled by limiting implantation power and implantation exposure time. The invention can optionally horizontally limit the location of the first sub-collector implant 112 by using a mask 90. If the mask 90 is used, the sub-collector implant 112 would be restricted to within the regions indicated by lines 92. In order to prevent the undesirable punch through, the lower sub-collector 112 should be positioned under the openings in the discontinuous sub-collector 114.

Figure 10:
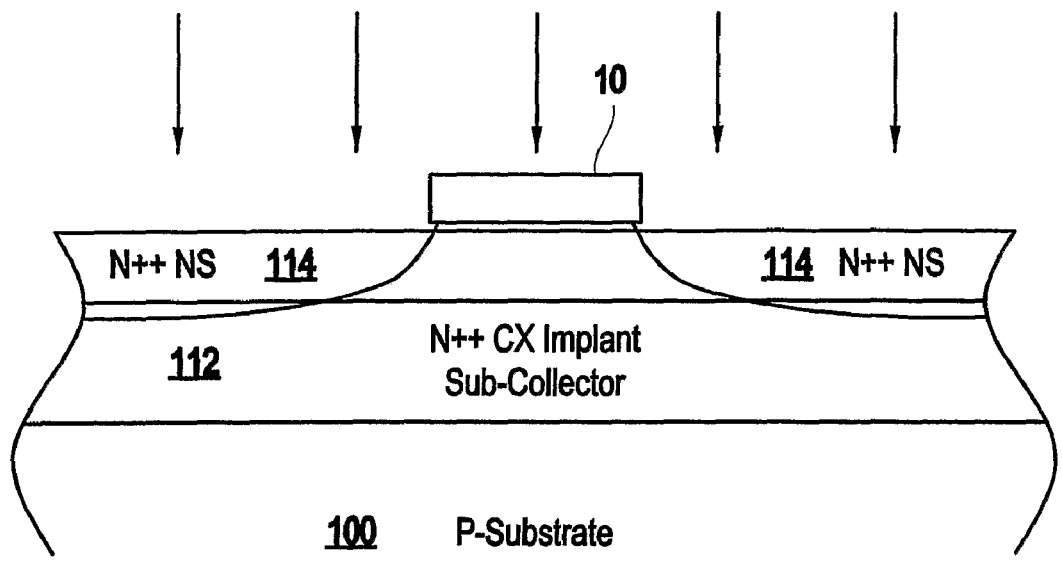
FIG. 10 is a schematic diagram illustrating a first epitaxial growth process.

Next, as shown in FIG. 10, the invention begins the process of forming the second sub-collector 114. The second sub-collector 114 implant has a higher dosage than the first sub-collector implant 112 and is made at the surface of the substrate 100, and is therefore termed a shallow implant. One feature of the invention is that a mask 10 is utilized to form the second sub-collector 114 as a discontinuous layer. The mask 10 is then removed and the structure undergoes an epitaxial growth process, as shown FIG. 11. This epitaxial growth process produces a doped collector region 116 and extends the second sub-collector regions 114 vertically.

The doping within the collector 116 has a lower impurity concentration than either the first sub-collector 112 or the second sub-collector 114. Therefore, the collector 116 has a first doping concentration, the first-sub-collector 112 has a second doping concentration higher than the first doping concentration, and the second-sub-collector 114 has an even higher third doping concentration that is higher than the second doping concentration. This epitaxial growth process shown in FIG. 11 is referred to as an auto doping process because the epitaxially grown regions 116, 114 are automatically doped and do not require additional impurity implantation steps. Conventional, well-known, processes are then used to form the various deep trenches 124, shallow trench isolation regions 122, bases 120, etc. to form the various diodes and transistors that are shown in FIGS. 1-6.

The processing shown in FIGS. 12-14 is similar to the processing shown in FIGS. 8-11; however, in the embodiment shown in FIGS. 12-14, the epitaxial auto doping process is performed before the first-sub-collector 112 is implanted. Therefore, FIG. 12 illustrates the discontinuous shallow second sub-collector impurity implant 114; FIG. 13 illustrates the epitaxial growth process; and FIG. 14 illustrates the deeper first sub-collector implant 112. After this point, various well-known processes are used to complete the diode, transistor, etc. structures shown in FIGS. 1-6.

A non-epitaxial process is shown in FIGS. 15-17. More specifically, this process again begins with a substrate 100, as shown in FIG. 8. Then, as shown in FIG. 15, the first sub-collector implant 112 is made deeply into the substrate 100. Note that this implant 112 it is made at a deeper vertical level than the implant shown in FIG. 9. This is because, as shown in FIGS. 16 and 17, the second sub-collector 114 and the collector 116 will be formed through implantation processes as opposed to epitaxial growth processes. Then, as shown in FIG. 16, an impurity implantation forms the second sub-collector 114. Again, this produces regions 114 that have a higher doping impurity concentration than the first sub-collector 112. Note that the processing in FIG. 16 again uses a mask 10 so that the second sub-collector 114 is discontinuous. Finally, as shown in FIG. 17, an additional lower doping implant is performed to create the collector region 116. After this point, various well-known processes are used to complete the diode, transistor, etc. structures shown in FIGS. 1-6.

While the second sub-collector regions 114 are discussed above as being ring-like or donut-shaped structures, the second sub-collector can comprise any discontinuous shape, depending upon the designer's requirements. Therefore, FIG. 18 illustrates one possibility where the second sub-collector 114 is formed only on one side of the structure. FIG. 19 illustrates an embodiment where the second sub-collector 114 is formed at multiple points. FIG. 20 illustrates an example where the second sub-collector 114 is formed over one side and the center of the structure. The location of the second sub-collector implant 114 is controlled through the shape of the mask 10. The foregoing embodiments shown in FIGS. 18-20 are merely examples, and many other discontinuous patterns could be utilized to tune the performance of the device being created depending upon the designer's requirements.

The inventive process can be continued by forming an optional isolation region for the sub-collector and collector region. This is achieved using a deep trench (DT) isolation process 124. This is formed by aligning to the collector edges, and providing a reactive ion etch (RIE) process forming a deep trough in the silicon substrate. An oxide is formed followed by a poly-silicon fill material.

The invention can also form shallow trench isolation regions 122 and then implant the second impurity into the epitaxial layer to form an active area 116 above the intrinsic transistor region. This implant can be an n-well implant or n-implant in the intrinsic region. Shallow trench isolation is formed using a RIE process, to define the opening for semiconductor device formation and opening for electrical connections to the tuning implant region and the injection reducing implant region of the collector and sub-collector.

The inventive process also continues so as to form the active and passive elements formed in a CMOS process or a BiCMOS. In a BiCMOS process, the silicon homo-junction bipolar transistor can be formed by selective epitaxial deposition above the wafer surface using deposition processes such as ultra-high vacuum chemical vapor deposition (UHV/CVD) processes. The intrinsic base region is formed where single crystal silicon is formed over the substrate silicon surface, and polysilicon is formed over the shallow trench isolation regions 122. This forms the base structure 120. The emitter structure 140 is formed by formation of oxide and nitride films, and spacer structures 144 to prevent shorting of the emitter and base regions. The emitter structure 140 is formed using mandrel structures where a hole is formed, an "inside spacer", followed by a polysilicon deposition. This formation of the emitter structure 140 is followed by a hot process to allow the emitter dopants to diffuse into the base film.

The inventive process continues to form the active and passive elements formed in a BiCMOS Silicon Germanium (SiGe) HBT or Silicon Germanium Carbon (SiGeC) HBT process. In a BiCMOS process, the SiGe HBT device can be formed by selective epitaxial deposition above the wafer surface using deposition processes such as ultra-high vacuum chemical vapor deposition (UHV/CVD) processes. The intrinsic base region is formed where single crystal silicon germanium is formed over the substrate silicon surface, and polysilicon germanium is formed over the shallow trench isolation regions 122. This forms the base structure 120. In the case of the SiGeC transistor, the Carbon is added to the base region to minimize the boron diffusion of the base dopants. The emitter structure 140 is formed by formation of oxide and nitride films, and spacer structures 144 to prevent shorting of the emitter and base regions. The emitter structure 140 is formed using mandrel structures where a hole is formed, an "inside spacer," followed by a polysilicon deposition. This formation of the emitter structure 140 is followed by a hot process to allow the emitter dopants to diffuse into the base film.

Then, various different processing can be performed to complete the structure into any one of a different number of devices, such as transistors, diodes, varactors, etc. depending on the structural elements of the specific element. For example, the varactor is formed by elimination of the emitter structure 140 utilizing only the base and the collector/sub-collector regions of the BJT or HBT device. Thus, after the foregoing processing, the standard raised base 120 and emitter structure 140 or other appropriate structures are formed depending upon the specific device (e.g., varactor, NPN diode, bipolar transistor, etc.) being manufactured. In the case of a diode structure, the p+/n-well implants of the CMOS process are used to form the diode, which is placed within the SiGe HBT sub-collector regions (e.g., which may include the DT region or other isolation structures).

While the precise dopants and concentrations used will vary between the different types of devices, one consistent feature of all the inventive structures is that the distance between opposing portions of the discontinuous sub-collector 114 (established by the mask 10) and the distance between the top of the collector 116 and the top of the sub-collector 114 tune the performance of the structure (e.g., tunes the breakdown voltage, transit frequency, current density, capacitance range, trigger and holding voltage, etc).

More specifically, the invention can space the opposing sections of the discontinuous sub-collector 114 further apart depending on the overall thermal budget or the point defects introduced by the subsequent processing steps (this influences the lateral diffusion of the dopant implanted) in order to tune performance of the transistors. The performance characteristics that are tunable include breakdown voltage, transit frequency, and current density. In the case of the varactor, the tunable characteristics include capacitance range and the Q. With the thyristor, the invention adjusts trigger and holding voltage.

By masking the sub-collector implant under the active area 116, the doping can be reduced in a controlled way down to the background level of the substrate 110 or epitaxial layer. The invention makes use of the lateral diffusion of the dopant injected during the sub-collector implant. By increasing or decreasing the distance between the active area 116 under the emitter and the sub-collector edge, the doping profile in the center of the active area 116 can be tuned to meet given requirements like breakdown voltage, transit frequency, current density, etc.

The present invention addresses the issue of mixed voltage interface applications, and cost of multiple device elements and provides a means of manufacturing a plurality of bipolar transistors of different breakdown voltage and frequencies without additional costs or masks using a "tuning" implant.

The present invention addresses the issue of vertical scaling of the collector and sub-collector regions in a bipolar junction transistor (BJT) or a hetero junction bipolar transistor (HBT) device by modulation of the spacing between the heavily doped region of the sub-collector and the base region to provide a range of different breakdown voltage and unity current gain cutoff frequency and unity power gain cutoff frequency without additional costs or masks again using the "tuning" implant.

The present invention addresses the issue of degradation of the unity power gain cutoff frequency with vertical scaling of the collector and sub-collector regions in a bipolar junction transistor (BJT) or a hetero junction bipolar transistor (HBT) device by modulation of the spacing between the heavily doped region of the sub-collector and the base region. The invention provides a range of different breakdown voltages and unity current gain cutoff frequency using the tuning implant and maintains a low sub-collector resistance with a second "injection reduction" implant 112.

The present invention addresses the issue of vertical minority carrier injection with vertical scaling of the collector and sub-collector regions in a bipolar junction transistor (BJT) or a hetero-junction bipolar transistor (HBT) device with a second "injection reduction" implant by placement of a deeper implant away from the "tuning implant" in the base-collector region which modulates the collector-to-emitter breakdown voltage (BVceo) sub-collector and maintains a low sub-collector resistance.

The present invention addresses the issue of the relationship between the breakdown voltage and the frequency response of a semiconductor structure by introducing a region of non-uniform doping to provide a personalization and customization of the parametric characteristics of the semiconductor device using a "tuning" implant.

The present invention addresses the issue of the relationship between the breakdown voltage and the frequency response of a semiconductor structure by introducing a region of non-uniform doping to provide a personalization and customization of the parametric characteristics of the semiconductor device as well as placement of a second implanted region ("injection reduction" implant) below, which maintains a low collector series resistance and minimizes noise injection.

The invention addresses the usage of a non-planar doped region, with at least one non-planar surface region to provide variations in the breakdown voltage, capacitance, resistance, and frequency response. From the well-known Johnson limit relationship, there is an inverse relationship between the breakdown voltage and the frequency response of transistor elements. As mentioned above, the sub-collector and "pedestal implants" are placed in a collector region to provide the reduction of the Kirk effect. Heavily doped sub-collector regions are placed in transistor elements and the associated derivatives to provide reduction of the Kirk effect. Additionally, the "pedestal implant" is brought closer to the surface to provide a lessened Kirk effect to achieve a lower breakdown voltage and higher frequency device. This pedestal implant requires an additional implant process step and adds cost to the semiconductor process. It is the motivation of the inventors to produce a HB and HP transistor without the usage of pedestal implants and the associated extra process steps. This is achievable by placement of an implant on at least one edge of the base-collector junction which initiates modulation of the breakdown voltage. The doped region can be placed in one location to lower the breakdown voltage between the base and collector regions or a plurality of locations between the base and collector regions.

Sub-collectors, in prior art technology, are uniformly doped within a transistor or its derivative structures forming a planar lower surface, and planar top surface within the device. Additional regions are placed on the top surface by the addition of a pedestal implant under the intrinsic device region, and a reach-through implant outside of the intrinsic device region. These non-uniformities in the doping profiles are established by additional implant steps which produce regions above the planar sub-collector top region, but not extending the higher doping regions below the top surface of the sub-collector.

Sub-collectors, in prior art technology, are formed using a rectangular mask shape where the rectangular region is filled with the sub-collector dopants in the entire interior of the rectangular mask region boundaries. A region which is to be "connected" if every two points can be joined by a piece-wise smooth curve which lies wholly in the region. This region is a "connected" region or "simply-connected" domain. For example, a square, or a rectangle, or an ellipse are all "connected" regions or "simply connected" regions. Hence, any arc between any two points can be continually shrunk and deformed and remain within the sub-collector region. The present invention, to the contrary, uses a sub-collector which is not simply connected but includes mathematically "multiply connected" sub-collector regions where any two points in the sub-collector boundary may extend outside of the defined sub-collector shapes. In the present invention, sub-collectors are formed not in the entire interior region of the semiconductor device. In the present invention, the sub-collector can be multiple implanted regions within the same device where they are multiply connected sub-collector domains, for example, two independent regions which are spaced by a non-implanted region. Additionally, a "donut" or "ring" implanted region can be formed by placement of a mask shape blocking the implant of the center region, forms a sub-collector region which is a multiply connected sub-collector region partially within the region in an enclosed discontinuous sub-collector 114 or simply connected discontinuous sub-collector 114. In the present invention, sub-collectors can be formed in simple connected impurity regions or a plurality of regions in the collector volume forming a multiply connected sub-collector domain. In the invention, the edge of the "ring" can be defined using the common iso-doping contours.

In the present invention, in the case of a "impurity ring" or "impurity donut" the surface of the sub-collector region is non-planar and non-uniform where the sub-collector non-planar region provides a deepening of the heavily doped region farther from the base region. This is in contrast to the case of a pedestal implant which provides a raising of the heavily doped region closer to the semiconductor device wafer surface. The present invention provides this capability by using a non-uniform top and bottom doped region 114 in the semiconductor device by masking certain regions of the sub-collector.

In the present invention, by lowering the peak doping concentration of the sub-collector region, the breakdown voltage and frequency response of the transistor structure can be modulated. By opening the size of the mask, doping concentration, or dose, the spacing between the doping concentration relative to the collector-to-base metallurgical junction can be modified. For a fixed dose and energy of the sub-collector region, modifying the size of the mask opening opens the spacing between the peak doping concentration of the sub-collector region and the collector-base metallurgical junction, whereby the breakdown voltage and frequency response of the transistor structure can be modulated. In the case of a ring or donut design, the size of the mask changes the size of the donut hole, hence, modulating the base-collector breakdown voltage and frequency response. From the Johnson Limit relationship, the product of the breakdown voltage and the frequency response are a constant. Hence, as one increases, the other decreases.

In order for this to be operable, the mask must be placed with the "intrinsic" transistor region. Typically, the unity current gain cutoff frequency is determined by the frequency response of the emitter-to-collector transit time. As a result, the region of modulation of the breakdown voltage and the frequency must be placed in the neighborhood of the intrinsic part of the transistor structure. The edges of the sub-collector implant can be doped under the "extrinsic" region of the transistor and diffuse laterally inward under the "intrinsic" region of the transistor.

The problem with the increase in the size of the "impurity ring 114" or placement of at least one edge implant at the base-collector junction region for tuning, is that the vertical injection increases. Therefore, the invention uses the deeper implant 112, 113 in the collector below the tuning implant. This injection reduction implant 112, 113 is placed deeper than the tuning implant 114 in the collector volume. This implanted region should be under the opening in the tuning implant to minimize the substrate 110 injection as well as deeper to avoid interfering with the tuning implant modulation capability. This deeper injection reduction implant can have a planar top surface, and planar bottom surface, or can be masked as was used in the tuning implant. This deeper implant 112, 113 can be formed prior to epitaxial deposition or implanted. This implant can be non-planar as well with either a non-planar top or bottom surface. This can be a complimentary implant which utilizes the tuning implant mask compliment and be self-aligned or non-self aligned to the tuning implant mask. In this fashion, the same mask can be used. In the case of an implanted injection reduction implant, the dopant placement can be the compliment of the tuning implant (e.g., for example in the case of a donut-type tuning implant with a center hole, the injection reduction implant can be placed in the "donut" hole using the compliment of the prior mask; such as using negative versus positive resist formation, or dual-tone hybrid resist methods, or other means).

This methodology produces a semiconductor structure that has an aforementioned sub-collector structure. The invention is not limited to the exemplary embodiments illustrated in FIGS. 1-6 and FIGS. 8-20. For example, the embodiments illustrated in FIGS. 1-6 and FIGS. 8-20 may be implemented with opposite polarity. Such a structure can be completed into many different types of structures including a varactor, an NPN diode, Schottky diode, bipolar transistor, thyristor, or diffused resistor. This concept of a tuning implant and injection reducing implant can be used in other HBT devices and corresponding passive elements in other materials and semiconductors including but not limiting to III-V compounds such as InP, GaAs, GaInP, and not limited to other semiconductor HBT devices which utilize a base-collector junction and a sub-collector region.

While the invention has been described in terms of preferred embodiments, those skilled in the art will recognize that the invention can be practiced with modification within the spirit and scope of the appended claims.

What is claimed is:

1. A semiconductor structure comprising:
    an active area having a first doping polarity and a first doping concentration;
    a substrate having a second doping polarity other than said first doping polarity;
    a first sub-collector overlying said substrate, said first sub-collector having said first doping polarity and a second doping concentration higher than said first doping concentration;
    a trench isolation region overlying said substrate and being disposed laterally adjacent to a portion of said active area; and
    a discontinuous second sub-collector overlying said substrate and having said first doping polarity, said second sub-collector being formed by implanting a dopant in a vertical direction into a portion of a semiconductor region exposed by a mask, said second sub-collector having a third doping concentration higher than said second doping concentration and including at least a portion disposed in the vertical direction below said isolation region and having a lateral discontinuity, wherein said second sub-collector includes a portion laterally adjacent to said active area, said active area adjoining said first sub-collector at said lateral discontinuity.

2. The semiconductor structure in claim 1, wherein said second sub-collector includes first and second edges spaced a first distance by said lateral discontinuity, wherein the first distance tunes the performance characteristics of said semiconductor structure.

3. The semiconductor structure in claim 2, wherein said performance characteristics that are tunable include breakdown voltage, unity current gain cutoff frequency, unity power gain cutoff frequency, transit frequency, current density, capacitance range, noise injection, minority carrier injection and trigger and holding voltage.

4. The semiconductor structure in claim 1, wherein said second sub-collector has non-planar upper and lower surfaces.

5. The semiconductor structure in claim 1 further comprising a device selected from the group consisting of a diode, a bipolar transistor, an heterojunction bipolar transistor, a Schottky diode, a varactor, and a thyristor.

6. The semiconductor structure in claim 1, wherein a performance characteristic of said semiconductor structure is tuned by adjusting a distance between a top surface of said active area and a top surface of said second sub-collector.

7. The semiconductor structure in claim 1, wherein a performance characteristic of said semiconductor structure is tuned by adjusting a peak doping concentration of said second sub-collector.

8. The semiconductor structure in claim 1, wherein a performance characteristic of said semiconductor structure is tuned by adjusting a spacing between peak doping concentration of discontinuous portions of said second sub-collector.

* * * * *